United States Patent [19]
Kluth et al.

[11] Patent Number: 5,872,876
[45] Date of Patent: Feb. 16, 1999

[54] OPTICAL FIBRE SENSOR ELEMENT

[75] Inventors: Erhard Lothar Edgar Kluth; Malcolm Paul Varnham, both of Alresford, United Kingdom

[73] Assignee: Sensor Dynamics Limited, Hampshire, United Kingdom

[21] Appl. No.: 795,814

[22] Filed: Feb. 5, 1997

[30] Foreign Application Priority Data

Feb. 16, 1996 [GB] United Kingdom ................... 9603251

[51] Int. Cl.$^6$ ..................................................... G02B 6/00
[52] U.S. Cl. ................................. 385/12; 385/13; 385/38
[58] Field of Search ................................. 385/12, 11, 13, 385/31, 32, 38, 39, 40, 50; 257/227.14, 227.15, 227.24

[56] References Cited

U.S. PATENT DOCUMENTS

| | | | |
|---|---|---|---|
| 3,903,497 | 9/1975 | Stimler et al. | 385/12 |
| 4,068,952 | 1/1978 | Erbert et al. | 385/12 |
| 4,489,602 | 12/1984 | Henning | 385/12 |
| 4,850,098 | 7/1989 | Yurek | 29/257.2 |
| 5,212,670 | 5/1993 | Brown | 367/149 |

FOREIGN PATENT DOCUMENTS

| | | |
|---|---|---|
| 2208711 | 8/1988 | United Kingdom . |
| 2250588 | 11/1991 | United Kingdom . |
| 2278439 | 5/1994 | United Kingdom . |
| 2284256 | 11/1994 | United Kingdom . |
| 2303445 | 7/1995 | United Kingdom . |

OTHER PUBLICATIONS

A.D. Kersy, A. Dandridge and A.B. Tveten Overview of Multiplexing Techniques for Interferometric Fiber Sensors SPIE vol. 838 Fiber Optic and Laser Sensors V (1987) pp. 184–193.

H.L. Price On the mechanism of transduction in optical fiber hydrophones J. Acoust. Soc. Am. 66(4), Oct. 1979 pp. 976–979.

Mark B. Moffett, Peter Shajenko and John W. Frye Comments on "On the mechanism of transduction in optical fiber hydrophones"[J. Acoust. Soc. Am. 66, 976–979 (1979)]pp. 1071.

R.N. Thurston Comments on "On the mechanism of transduction in optical fiber hydrophones"[J. Acoust. Soc. Am. 66, 976–979 (1979)]J. Acoust/ Soc. Am. 67(3); Mar. 1980 pp. 1072–1073.

*Primary Examiner*—Phan T. H. Palmer
*Attorney, Agent, or Firm*—Iandiorio & Teska

[57] ABSTRACT

An optical fibre sensor element (1) comprising an optical fibre (2), a protective coating on the optical fibre, and shape constraining means (3) which causes the optical fibre (2) to follow a path which extends in a generally longitudinal direction and which is such that the coated optical fibre (3) is not perfectly straight and it is impossible to draw an imaginary straight line in any direction which remains inside the coated optical fibre (3) along the entire length of the optical fibre sensor element (1).

10 Claims, 4 Drawing Sheets

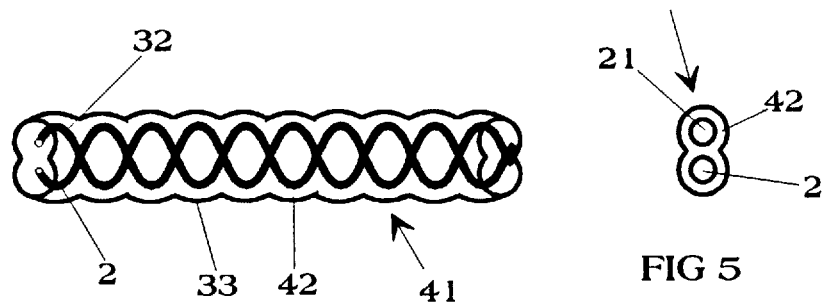
FIG 4
FIG 5
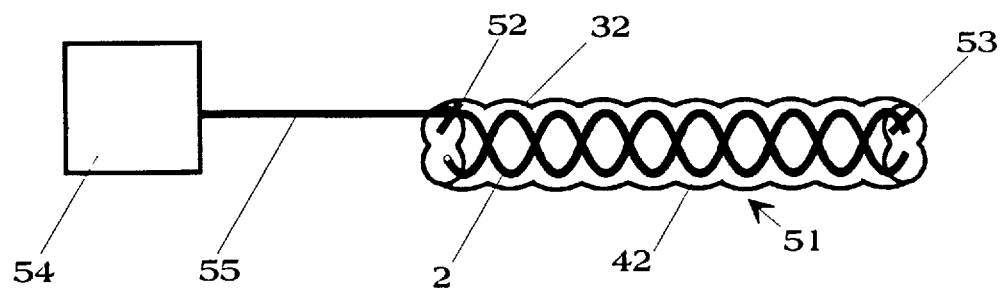
FIG 6

OPTICAL FIBRE SENSOR ELEMENT

FIELD OF THE INVENTION

This invention relates to apparatus for sensing one or more parameters and, more especially, this invention relates to the configuration of an optical fibre sensor element to increase its sensitivity to a measurement parameter. The invention has especial relevance for downhole sensing in the oil and gas industry, and for the manufacture of thin seismic streamers.

DESCRIPTION OF THE RELATED ART

There is an increasing demand in the oil and gas industry to improve the percentage of oil and gas recovered from reservoirs and to reduce operating costs. This has resulted in the demand for sensing techniques which can guarantee the availability of downhole measurement over the lifetime of a reservoir. A technique which addresses this requirement is to pump optical fibre sensors and their associated cables into the reservoir through hydraulic control lines placed in oil or gas wells. These control lines can have an internal diameter of around 4 mm and will not accept relatively large optical fibre sensing elements containing coils of fibres.

Pumping sensors along hydraulic control lines can also be applied to the measurement of pressure, temperature, acoustic energy, magnetic fields and electric fields in other types of wells, for example geothermal and sulphur wells, and in nuclear power stations, mining, refining, chemical processing plants and remote locations.

An altogether different requirement exists in the design of seismic streamers which are towed behind large ocean-going ships during seismic surveys. Here the streamers have a large diameter, often not less than 40 mm. This large diameter causes significant drag from each seismic streamer. A way to reduce the drag of the streamer is to reduce its diameter. For example, the hydrophone elements in the streamer may be spaced typically every 12.5 m over a length of 3 km, whereas streamers may be separated by 100 m. A desired configuration is to have the separation between hydrophones approximately equal to the separation between hydrophones in the streamers—ie to form a grid of hydrophones behind the ship. This however is not possible unless the hydrophone diameter is greatly reduced. Unfortunately, this is difficult with existing piezoelectric hydrophones and it is also difficult with optical fibre hydrophones where the acoustic sensitivity of the hydrophones is created by coiling the fibre on spools.

It is possible to increase the sensitivity of optical fibre hydrophones by coating a fibre with suitable compliant materials such as polymers. Such a fibre sensor can be made compatible with pumping down hydraulic control lines into oil or gas wells, and can also form the basis for making hydrophone arrays which can be packaged into thin streamers for seismic surveying applications.

One important problem with this approach is that it is difficult to predict the acoustic sensitivity of such hydrophones because the sensitivity to acoustic signals when the fibre is completely straight is different from the sensitivity to acoustic signals when the fibre is curved. This is because the acoustic signal is not applied to the ends of a perfectly straight fibre. The fibre is in effect squeezed by the acoustic signal. This is not the case for a fibre which is in general curved, in which case the acoustic signal is applied effectively in all directions. (Squeezing a fibre from the sides only will cause a fibre to increase in length, whereas applying pressure from all directions will cause a fibre to decrease in length). The result is that the acoustic sensitivity of a sensor fabricated simply by coating a fibre will not be predictable and may fluctuate as the fibre is moved.

SUMMARY OF THE INVENTION

An aim of the present invention is to configure an optical fibre sensor element to increase its sensitivity to a measurement parameter.

Accordingly, the present invention provides an optical fibre sensor element comprising an optical fibre, a protective coating on the optical fibre, a sensitivity enhancing coating for increasing the sensitivity to applied hydrostatic pressure, and shape constraining means which causes the optical fibre to follow a path which extends in a generally longitudinal direction and which is such that the coated optical fibre is not perfectly straight and it is impossible to draw an imaginary straight line in any direction which remains inside the coated optical fibre along the entire length of the optical fibre sensor element.

The invention has especial relevance for downhole sensing in the oil and gas industry, and for the manufacture of thin seismic streamers where reduced drag and suppression of tow noise is important.

In first embodiment of the invention, the shape constraining means may include an elongated member which is twisted with the coated optical fibre.

The elongated member may be made from a magnetostrictive material such as nickel wire, in which case the optical fibre sensor element will be a magnetostrictive sensor element sensitive to magnetic fields.

The elongated member may alternatively be made from an electrostrictive material such as polyvinylidene fluoride, in which case the optical fibre sensor element will be an electrostrictive sensor element sensitive to electric fields.

The elongated member may be made from a material such as a polymer to enhance the acoustic sensitivity in which case the optical fibre sensor element will be an optical fibre hydrophone sensor element.

The elongated member may be a capillary for increasing the sensitivity of the optical fibre sensor element to applied hydrostatic pressure, the optical fibre sensor element being an optical fibre sensor hydrophone element. A preferred embodiment for the capillary is a silica capillary. The silica capillary can be drawn and coated in a similar manner to that used in the manufacture of optical fibre cables in order to increase the capillary's, and hence the hydrophone element's strength when exposed to large hydrostatic pressures such as those occurring in downhole applications in oil and gas wells. The advantage of the capillary when used in a hydrophone is that it can be designed to deform more than a solid member thus increasing the sensitivity of the hydrophone element to applied hydrostatic pressure. The capillary may be sealed one or more times along its length, and especially at each end of the optical fibre sensing element. The resulting hydrophone element may be coated in a polymer to bind the structure together, and to increase the acoustic sensitivity.

In a second embodiment of the invention 1, an optical fibre sensor element is, the optical fibre sensor element is an optical fibre hydrophone element. It is preferred that the sensitivity enhancing coating has a non-uniform outside surface in order to stabilise the sensitivity of the optical fibre hydrophone element to acoustic signals. A preferred embodiment is such that it is impossible to draw a straight line in any direction which remains inside the sensitivity enhancing coating along the entire length of the optical fibre sensor element thus equalising the strain coefficients along each axis when the optical fibre sensing element is subject to hydrostatic pressure. The sensitivity of the optical fibre hydrophone element will then be stabilised.

In a third embodiment of the invention, an optical fibre sensor element includes first reflective means and second reflective means which form an interferometric sensing cavity sensitive to hydrostatic pressure At least one of the first and second reflective means may be an optical fibre Bragg grating, a partially reflective splice, or if at the end of a cable, the second reflective means may be a mirror fabricated by coating metal such as chrome and gold onto the end face of the fibre.

Such an embodiment can be combined to form an optical fibre hydrophone array comprising a multiplicity of optical fibre hydrophone elements joined together by optical fibre. This embodiment is particularly advantageous for incorporation into seismic streamers or pumping downhole for instance into oil and gas wells through hydraulic control lines.

It is known that the wavelength of light from an optical fibre Bragg grating is sensitive to temperature. Thus an overall system may include monitoring means for monitoring the wavelength of light reflected from the optical fibre Bragg grating in order to determine the temperature of the optical fibre Bragg grating, thereby allowing a combination of temperature and another measurement parameter to be measured in the same optical fibre sensor element. The optical fibre sensor element may include separate temperature sensing means for removing the pressure dependence of the temperature measurement, thereby yielding measurements of pressure at the Bragg grating, temperature, and an acoustic signal.

In a fourth embodiment of the present invention, the optical fibre sensor element is of such a size and disposition that it can be pumped, together with its associated cable, through a conduit to remote locations such as into an oil, gas, sulphur or geothermal well or a mine. The purpose of the-cable is to connect the optical fibre sensing element to electro-optic instrumentation which would typically be situated above ground. The pumping may utilise fluid drag using gas, or a liquid such as water, water glycol mixture, or silicone oil. Thus the present invention provides apparatus for extracting at least one of oil and gas from below ground, which apparatus includes a well head, production tubing, a conduit, an optical fibre sensor element of the invention, and a cable for connecting the optical fibre sensor element to sensor instrumentation, the optical fibre sensor element and a part of the cable being such that they have been pumped along the conduit, and the optical fibre sensor element being an optical fibre hydrophone sensor element. Preferably, the conduit has an internal diameter of 2 mm–30 mm.

The optical fibre sensor element may be an optical fibre hydrophone element having a length of around 0.5 m to 30 m.

The conduit may have an internal diameter of 2 mm–30 mm and may preferably be hydraulic control line or coiled tubing—both commonly available and used in the oil and gas industry. More preferably, the optical fibre sensing element may be of such a design that it can be pumped through a conduit containing multiple bends.

The conduit may contain a pressure communication device which communicates the pressure from outside the conduit to the inside of the conduit in the vicinity of the optical fibre hydrophone sensor element.

The conduit may be cemented to the outside of the casing of the apparatus.

The present invention also provides an optical fibre sensor array comprising a plurality of the optical fibre sensor elements, the optical fibre sensor elements being joined together by optical fibre.

A seismic streamer may be constructed comprising a plurality of the optical fibre sensor arrays, and where at least one of the optical fibre sensor arrays contains a plurality of optical fibre hydrophone sensor elements. Each optical fibre hydrophone sensor element may have a length of around 0.1 m to 30 m rather than the 30 m–300 m currently used in bobbin-wound conventional optical hydrophone coils.

The seismic streamer may include a distributed temperature sensor for measuring the temperature along the seismic streamer.

The cross section of the seismic streamer may be non-circular in order to facilitate its winding onto drums. This is a preferred embodiment of the invention with major reductions on the diameter of the streamers used currently and demanding less space for storing the seismic streamer. Such a thin seismic streamer has advantage where reduced drag and suppression of tow noise are important.

BRIEF DESCRIPTION OF THE DRAWINGS

Embodiments of the invention will now be described solely by way of example and with reference to the accompanying drawings in which:

FIG. 4 shows an optical fibre hydrophone element with a non-uniform coating;

FIG. 5 is a cross section through the optical fibre hydrophone element shown in FIG. 4;

FIG. 6 shows an optical fibre hydrophone with first and second reflective means;

DESCRIPTION OF THE PREFERRED EMBODIMENTS

Figure 1:
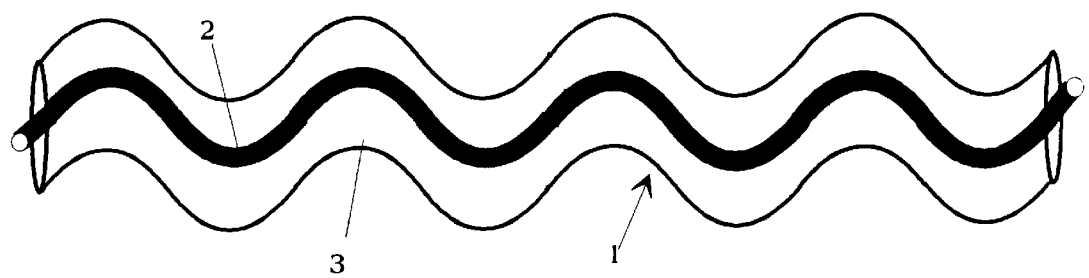
FIG. 1 shows an optical fibre sensor element comprising a coated optical fibre which is packaged in a shape constraining means.

Referring to FIG. 1, there is shown apparatus for sensing one or more parameters comprising an optical fibre sensor element 1. The optical fibre sensor element 1 comprises an optical fibre 2 which is coated with a protective coating. The coated optical fibre 2 is packaged in shape constraining means 3 which causes the coated optical fibre 2 to follow a path which extends in a generally longitudinal direction and which assures that the coated optical fibre is not held perfectly straight that is it is impossible to draw an imaginary straight line in any direction which remains inside the coated optical fibre along the entire length of the optical fibre sensor element.

The optical fibre sensor element 1 may have a helical form similar to a stretched telephone handset cable.

The coated optical fibre 2 is preferably one specifically designed for operation in water and/or high-temperatures and pressures. Such fibres are usually provided with a protective coating of a polymer such as silicone, polytetrafluoroethylene, acrylates or polyimide. The fibres are often carbon coated prior to the application of the polymer in order to improve hermeticity.

The shape constraining means 3 may be fabricated from a polymer such as for example a polyurethane which has the advantages of being very robust. If the optical fibre sensor element 1 were subjected to hydrostatic pressure, the pressure would act in all directions within the optical fibre sensor element 1 reducing its dimensions in all directions. This would not be the case if the optical fibre sensor element 1 were straight and hydrostatic pressure were applied to only a part of the optical fibre sensor element 1 whereupon the linear length of the optical fibre sensor element 1 would increase. This lengthening occurs only if the optical fibre sensor element 1 is straight. If it is curved, the optical fibre sensor element 1 will shorten. This effect has particular relevance to acoustic sensors and to hydrophones where an acoustic pressure wave is applied to only a short section of the optical fibre sensor element 1. It is important to know whether this acoustic pressure wave will increase or decrease the length of optical fibre sensor element 1. Ensuring by design that the coated optical fibre 2 is not completely straight results in a known response to the acoustic pressure wave. The embodiment shown in FIG. 1 can therefore be seen to stabilise the response of the acoustic sensor to pressure waves and thus to acoustic signals.

Figure 2:
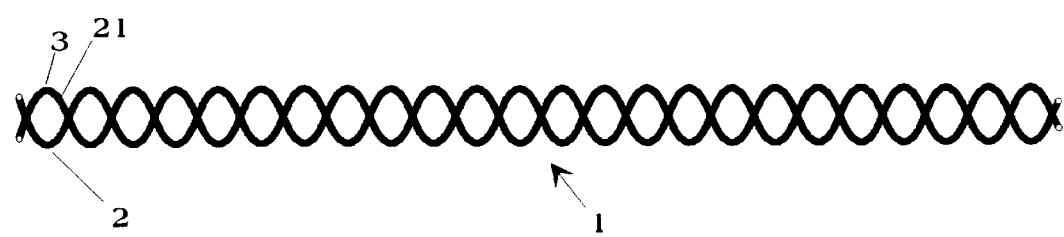
FIG. 2 shows an optical fibre sensor element comprising a coated optical fibre twisted with a elongated member.

FIG. 2 shows an embodiment where the optical fibre sensor element 1 is constructed by twisting the coated optical fibre 2 and an elongated member 21. This embodiment assures that the coated optical fibre 2 is not held perfectly straight, that is it is impossible to draw a straight line in any direction which remains inside the coated optical fibre 2 along the entire length of the optical fibre sensor element 1.

The optical fibre sensor element 1 may be a hydrophone element sensitive to acoustic signals, and the elongated member 21 may be a capillary. The advantage of the capillary when used in a hydrophone is that it will deform more than a solid member thus increasing the sensitivity of the hydrophone element to applied hydrostatic pressure.

Figure 3:
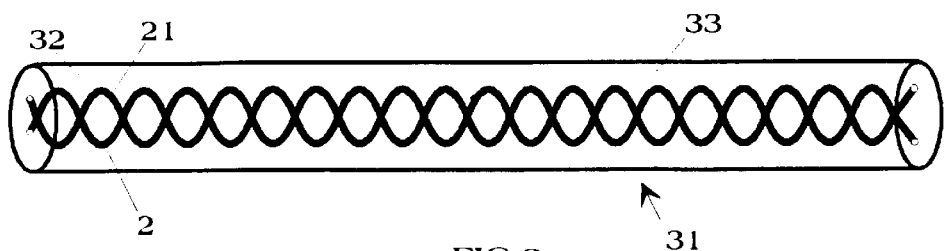
FIG. 3 shows an optical fibre sensor element comprising a coated optical fibre twisted with a elongated member and the entire assembly coated.

FIG. 3 shows a particularly advantageous configuration for a hydrophone element 31 where the elongated member 21 is a silica capillary 32 which is drawn from a larger capillary in a similar manner to the method for drawing optical fibres. The silica capillary 32 can be coated in manufacture with the same coatings used in optical fibre manufacture in order to increase the strength of the silica capillary 32, and hence the strength of the hydrophone element 31 when exposed to large hydrostatic pressures such as those occurring in downhole applications in oil and gas wells. A sensitivity enhancing coating 33 is applied to the resulting hydrophone element 31 in order to bind the structure together, and to increase the acoustic sensitivity yet further. The coating 33 may be a polyurethane.

FIGS. 4 and 5 show an embodiment for a hydrophone element 41 where the sensitivity enhancing coating 33 is a non-cylindrical coating 42 where the axial symmetry of the outside surface is broken. The advantage of this embodiment in comparison to the embodiment shown in FIG. 3 is that hydrostatic pressure applied to the outside does not merely squeeze the hydrophone element 41, but couples into the structure more uniformly in all three orthogonal directions. This results in an improved stability of the response to pressure changes and enhancement of the sensitivity of the hydrophone element 41 to acoustic signals. It is preferred that the non-uniformity is increased to such an extent that it is impossible to draw a straight line in any direction through the hydrophone element 41 which remains inside the hydrophone element 41 along its entire length.

FIG. 6 shows an embodiment for an optical fibre hydrophone element 51 where a first reflective means 52 is incorporated into the coated optical fibre 2 near one end of the optical fibre hydrophone element 51 and a second reflective means 53 is incorporated into the coated optical fibre 2 near the other end of the optical fibre hydrophone element 51 so as to form an interferometric sensing cavity sensitive to hydrostatic pressure and acoustic signals. One end of the optical fibre hydrophone element 51 is connected to optical fibre hydrophone electro-optical instrumentation 54 with an optical fibre cable 55.

The first and second reflective means 52, 53 may be an optical fibre Bragg grating, or a partially reflective splice. If desired, at the end of a cable, the second reflective means 53 may be a mirror fabricated by coating metal such as chrome or gold onto the end face of the fibre.

Figure 7:
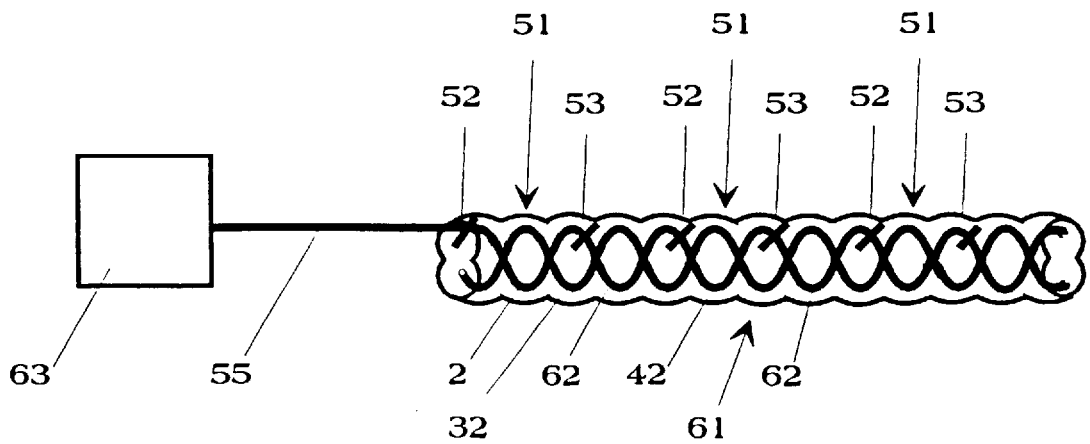
FIG. 7 shows an optical fibre hydrophone array.

The embodiment of FIG. 6 can be combined as shown in FIG. 7 to form an optical fibre hydrophone array 61 comprising a multiplicity of the optical fibre hydrophone elements 51 joined together by optical fibres 62 and connected to optical-fibre hydrophone-array electro-optical instrumentation 63 by the optical fibre cable 55.

The outer diameter of the optical fibre hydrophone array 61 may be approximately 1 mm, made up from the coated optical fibre 2 having a diameter of around 0.25 mm, the silica capillary 32 having a diameter of around 0.25 mm, and the coating 33. Such dimensions make it ideal for pumping through hydraulic control lines into oil and gas wells in order to monitor electrically submersed pumps, chokes and valves, and to monitor sand production and flow rates from an oil reservoir.

The outer diameter of the optical fibre hydrophone array 61 of approximately 1 mm makes the array ideal for incorporation into seismic streamers where 10 to 100 optical fibre hydrophone elements 51 or more may be fabricated into a single array linked back to the seismic survey ship by the optical fibre cable 55. If each optical fibre hydrophone element 51 were around 5 m in length, and separated by 12.5 m, and if 100 optical fibre hydrophone elements 51 were incorporated into each array, a 3 km streamer could be fabricated from three optical fibre hydrophone arrays 61 with the optical-fibre hydrophone-array electro-optic instrumentation 63 kept on board the seismic survey ship. Each streamer could then be made far thinner than the 40 mm to 50 mm diameter streamers currently in use in the seismic survey business. The length of the optical fibre hydrophone element 51 may typically be 1 to 10 m long which would make its sensitivity one to two orders of magnitude less than conventional bobbin-wound optical hydrophone coils. Although at first sight this may seem a major disadvantage, conventional optical hydrophone coils have been designed for military use, for example, for detecting submarines at great distances in deep water. This is not the same requirement as for typical seismic surveys which are often carried out in fairly shallow water (such as the North Sea) where the levels of background acoustic noise are far higher.

There may also be an advantage in using thinner coated optical fibre 2 with a glass diameter of around 80 $\mu$m or less with a coated diameter of around 10 $\mu$m in order to further increase acoustic sensitivity or effect a higher packing density in the final structure.

If the optical fibre hydrophone array 61 were to use Bragg gratings for the first and second reflective means 52, 53, then it is possible to interrogate the optical fibre Bragg gratings in order to determine the centre wavelength reflected back to the instrumentation. This centre wavelength is pressure and temperature sensitive, thus allowing acoustic signals and a measurement of pressure and temperature to be monitored in the same array. In the seismic streamer application, it would be necessary to remove the temperature dependence of the pressure measurement derived from the Bragg grating in order to calculate the depth of the streamer. This could be achieved by including a distributed temperature sensor fibre in the streamer which is interrogated by a distributed temperature sensor such as the York DTS 80 manufactured by York Sensors Limited of England.

The seismic streamer can be designed with one or more optical fibre hydrophone arrays 61 together with a distributed temperature sensor fibre all packaged in a thin (less than around 20 mm outer diameter) polyurethane sleeve containing kerosene for buoyancy control. This could advantageously be designed with a non-circular cross-section to aid coiling onto small diameter drums and to provide a hydrodynamic fin-like structure such as seen in keels of sailing boats. The latter structure will reduce tow noise and drag, and dampen torsional modes of a long array. One of the consequences of these design approaches is that streamers may be of significantly longer length than the 3 km in current use, and more streamers may be towed in a grid-like pattern.

Figure 8:
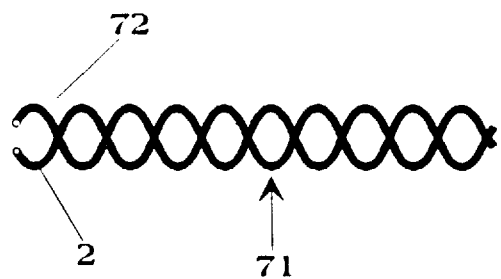
FIG. 8 shows a magnetic field sensor.
Figure 9:
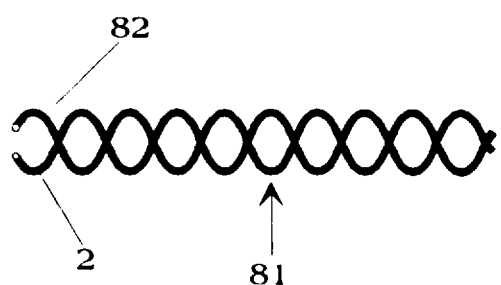
FIG. 9 shows an electric field sensor.

FIG. 8 shows an embodiment of the invention which is aimed at sensing magnetic fields. The apparatus comprises a magnetostrictive sensor element 71 comprising the coated optical fibre 2 twisted with a magnetostrictive elongated member 72 which contains magnetostrictive material along its length. The magnetostrictive elongated member 72 may be nickel wire which is magnetostrictive. Partially reflective mirrors may be incorporated into this embodiment and arrays formed in a similar manner to the optical hydrophone array 61, Arrays of electric field sensors can be made using multiples of an electrostrictive sensor element 81 shown in FIG. 9 where the coated optical fibre 2 is twisted around an electrostrictive elongated member 82 which contains electrostrictive material, for example polyvinylidene fluoride.

The sensor elements described above may be combined into arrays sensing acoustic, magnetic field and electric field signals. The sensor elements may be incorporated into the same arrays, or they may be combined in separate arrays.

Figure 10:
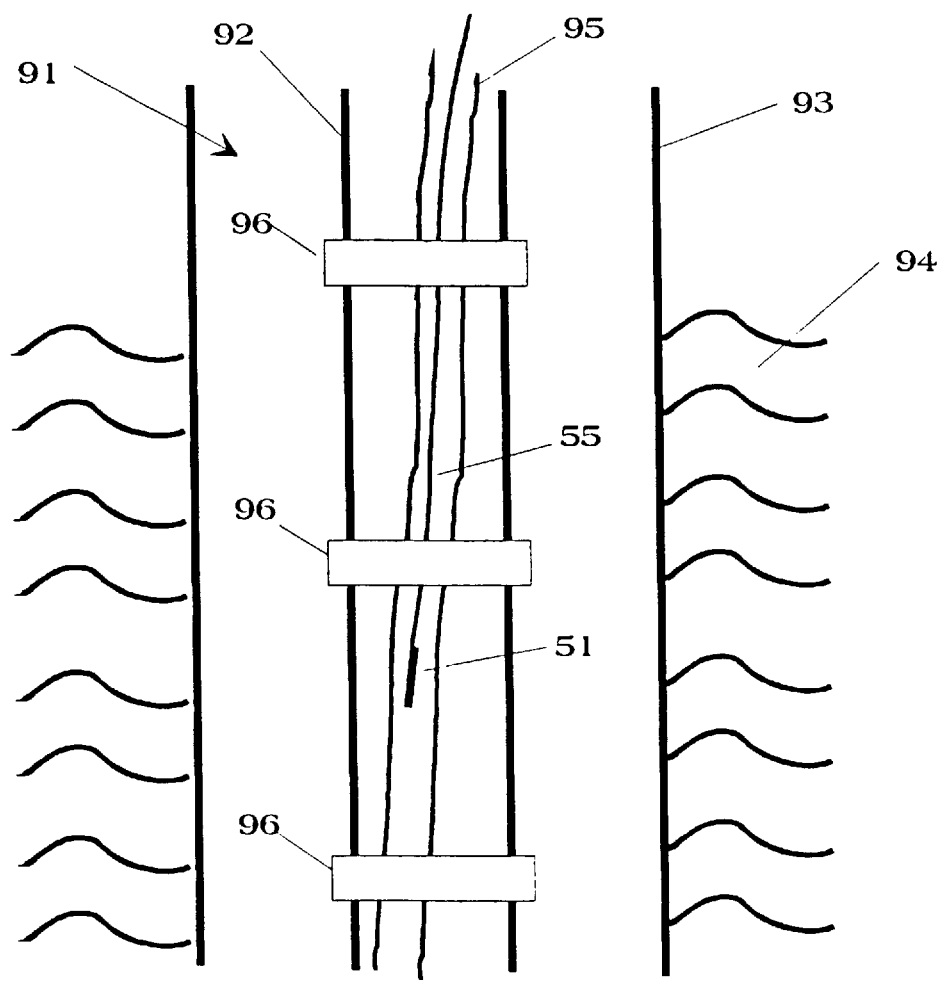
FIG. 10 is a cross section through an oil well.

A section through a typical oil well 91 is shown in FIG. 10. The oil well 91 contains a length of production tubing 92 through which oil flows to the surface, a casing 93 which separates a rock formation 94 from the inside of the oil well 91, and a conduit 95 strapped to the outside of the production tubing 92 by straps 96. The conduit 95 is typically a hydraulic control line which may either be strapped to the outside of the production tubing 92 as shown, or alternatively cemented to the outside of the casing 93 in order to enhance the acoustic coupling from the reservoir to an optical fibre hydrophone sensing element 51 which has been pumped through the conduit 95 using fluid drag from either a gas such as nitrogen or methane, or a liquid such as water, a mixture of water and glycol, a light-grade oil, or a silicone oil. The acoustic coupling may also be improved with a pressure communication means (not shown) such as a valve or an orifice or a membrane located in the vicinity of the optical fibre sensing element 51 connecting fluid inside the conduit 95 to the outside.

It is to be appreciated that the embodiments of the invention described above with reference to the accompanying drawings have been given by way of example only and that modifications and additional components may be provided to enhance performance.

We claim:

1. An optical fibre sensor element comprising an optical fibre, a protective coating on the optical fibre, a sensitivity enhancing coating for increasing the sensitivity to applied hydrostatic pressure, and shape constraining means which causes the optical fibre to follow a path which extends in a generally longitudinal direction and which is such that the coated optical fibre is not perfectly straight and it is impossible to draw an imaginery straight line in any direction which remains inside the coated optical fibre along the entire length of the optical fibre sensor element.

2. Apparatus for extracting at least one of oil and gas from below ground, which apparatus includes a well head, production tubing, a conduit, an optical fibre sensor element according to claim 1, and a cable for connecting the optical fibre sensor element to sensor instrumentation, the optical fibre sensor element and part of the cable being such that they have been pumped along the conduit, and the optical fibre sensor element being an optical fibre hydrophone sensor element.

3. Apparatus according to claim 2 in which the conduit contains a pressure communication device which communicates the pressure from outside the conduit to inside of the conduit in the vicinity of the optical fibre hydrophone sensor element.

4. Apparatus according to claim 2 in which the conduit is cemented to the outside of a casing of the apparatus.

5. An optical fibre sensor element according to claim 1 in which the shape constraining means includes an elongated member which is twisted with the coated optical fibre.

6. An optical fibre sensor element according to claim 5 in which the elongated member is a capillary for increasing the sensitivity of the optical fibre sensor element to applied hydrostatic pressure, the optical fibre sensor element being an optical fibre sensor hydrophone element.

7. An optical fibre sensor array comprising a plurality of optical fibre sensor elements according to claim 1, the optical fibre sensor elements being joined together by optical fibre.

8. A seismic streamer comprising a plurality of optical fibre sensor arrays according to claim 7, and in which at least one of the optical fibre sensor arrays contains a plurality of optical fibre hydrophone sensor elements.

9. An optical fibre sensor element according to claim 1, the optical fibre sensor element being an optical fibre hydrophone element.

10. An optical fibre sensor element according to claim 1 and including first reflective means and second reflective means which form an interferometric sensing cavity sensitive to hydrostatic pressure, the optical fibre sensor element being an optical fibre hydrophone sensor element.

* * * * *